(12) United States Patent
Yan

(10) Patent No.: US 12,507,435 B2
(45) Date of Patent: Dec. 23, 2025

(54) SHIELD GATE TRENCH MOSFET DEVICE AND METHOD FOR MANUFACTURING THE SAME

(71) Applicant: Shanghai Huahong Grace Semiconductor Manufacturing Corporation, Shanghai (CN)

(72) Inventor: Shufan Yan, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 616 days.

(21) Appl. No.: 17/903,204

(22) Filed: Sep. 6, 2022

(65) Prior Publication Data
US 2023/0124023 A1 Apr. 20, 2023

(30) Foreign Application Priority Data

Oct. 20, 2021 (CN) .......................... 202111224818.8

(51) Int. Cl.
H10D 30/66 (2025.01)
H10D 30/01 (2025.01)
(Continued)

(52) U.S. Cl.
CPC ....... H10D 30/668 (2025.01); H10D 30/0297 (2025.01); H10D 30/6894 (2025.01);
(Continued)

(58) Field of Classification Search
CPC ............. H10D 30/668; H10D 30/0297; H10D 30/6894; H10D 64/513; H10D 64/117; H10D 64/64
See application file for complete search history.

(56) References Cited

U.S. PATENT DOCUMENTS 11,056,595 B2* 7/2021 Lee ...................... H10D 84/146
2013/0075808 A1* 3/2013 Calafut .................. H10D 84/00
257/E29.338
(Continued)

FOREIGN PATENT DOCUMENTS

CN 104681448 A 6/2015
CN 108257869 A 7/2018
(Continued)

OTHER PUBLICATIONS

Chinese search report dated Jun. 23, 2023 issued for corresponding to CN2021112248188, English translation provided.

Primary Examiner — Joseph C. Nicely
(74) Attorney, Agent, or Firm — Harris Beach Murtha Cullina PLLC

(57) ABSTRACT

A shield gate trench MOSFET device includes a substrate and a trench in the substrate. A lower portion of the trench is filled with a shield gate dielectric layer and a first polysilicon layer. An upper portion of the trench is filled with a first dielectric layer, a second polysilicon layer, and a second dielectric layer. The second dielectric layer is located above the second polysilicon layer, and the top of the second polysilicon layer is lower than the surface of the substrate. A well region is located outside the trench, and a Schottky implantation region is located outside the well region. The bottom of the Schottky implantation region is higher than the bottom of the well region. The well region includes a source region and a well contact region. The well contact region is located between the source region and the Schottky implantation region.

3 Claims, 9 Drawing Sheets

(51) Int. Cl.
*H10D 30/68* (2025.01)
*H10D 64/00* (2025.01)
*H10D 64/27* (2025.01)
*H10D 64/64* (2025.01)

(52) U.S. Cl.
CPC ......... *H10D 64/117* (2025.01); *H10D 64/513* (2025.01); *H10D 64/64* (2025.01)

(56) References Cited

U.S. PATENT DOCUMENTS

| | | | |
|---|---|---|---|
| 2019/0074373 A1* | 3/2019 | Kobayashi | H10D 62/157 |
| 2020/0105890 A1 | 4/2020 | Tu et al. | |
| 2020/0295159 A1 | 9/2020 | Yang et al. | |
| 2021/0119030 A1* | 4/2021 | Hsieh | H10D 64/256 |

FOREIGN PATENT DOCUMENTS

| | | | | |
|---|---|---|---|---|
| CN | 109065542 A | | 12/2018 | |
| CN | 110335895 A | * | 10/2019 | ............ H10D 30/60 |
| CN | 111261717 A | | 6/2020 | |
| CN | 111403292 A | | 7/2020 | |

\* cited by examiner

SHIELD GATE TRENCH MOSFET DEVICE AND METHOD FOR MANUFACTURING THE SAME

CROSS-REFERENCES TO RELATED APPLICATIONS

This application claims priority to Chinese patent application No. CN 202111224818.8, filed at CNIPA on Oct. 20, 2021, and entitled "SHIELD GATE TRENCH MOSFET DEVICE AND METHOD FOR MANUFACTURING THE SAME", the disclosure of which is incorporated herein by reference in its entirety.

TECHNICAL FIELD

The present application relates to the field of semiconductor manufacturing, in particular to a shield gate trench MOSFET device and a method for manufacturing the same.

BACKGROUND

As the demand for electronic products grows, the demand for power MOSFET devices becomes increasingly larger. Trench MOSFETs are widely applied in the field of low-voltage power due to the relatively high device integration, relatively low on-resistance, and relatively large current capacity thereof.

Based on the improved performance requirements of electronic products, the performance requirements of power MOSFET devices used in electronic products also become increasingly higher, and shield gate trench MOSFET devices pursue a faster switching speed.

SUMMARY

In order to solve the technical problem in the prior art, the present application provides a shield gate trench MOSFET device and a method for manufacturing the same. The technical solutions are as follows:

According to a first aspect, an embodiment of the present application provides a shield gate trench MOSFET device, including:

a substrate, a trench being provided in the substrate.

A lower portion of the trench is filled with a shield gate dielectric layer and a first polysilicon layer, the shield gate dielectric layer covers the side wall and bottom of the trench, and the first polysilicon layer is located between the shield gate dielectric layers.

An upper portion of the trench is filled with a first dielectric layer, a second polysilicon layer, and a second dielectric layer, the first dielectric layer is located above the shield gate dielectric layer and the first polysilicon layer, the second polysilicon layer is located above the first dielectric layer, the second dielectric layer is located above the second polysilicon layer, and the top of the second polysilicon layer is lower than the surface of the substrate.

The substrate is further provided with a well region and a Schottky implantation region, the well region is located outside the trench, the Schottky implantation region is located outside the well region, and the bottom of the Schottky implantation region is higher than the bottom of the well region.

A source region and a well contact region are provided in the well region, and the well contact region is located between the source region and the Schottky implantation region.

Optionally, the source region is located at the top of the well region and in the well region corresponding to the side wall of the top of the trench.

The well contact region is located at the top of the well region.

Optionally, the surface of the second dielectric layer is higher than the surface of the substrate.

Optionally, the surface of the second dielectric layer is flush with the surface of the substrate.

Optionally, the shield gate trench MOSFET device further includes a front metal layer on the front side of the substrate, and a back metal layer on the back side of the substrate.

According to a second aspect, an embodiment of the present application provides a method for manufacturing a shield gate trench MOSFET device, the method including:

forming a hard mask layer on the surface of a substrate, and forming a trench in the substrate by means of photolithography and etching processes;

forming a shield gate dielectric layer and a first polysilicon layer, the shield gate dielectric layers covering the side wall and bottom of a lower portion of the trench, and the first polysilicon layer being located between the shield gate dielectric layers;

forming a first dielectric layer;

forming a second polysilicon layer, the first dielectric layer being located above the first polysilicon layer, the second polysilicon layer being located above the first dielectric layer, the surface of the second polysilicon layer being lower than the surface of the substrate;

performing first lateral etching on the hard mask layer to define a well implantation region pattern outside the trench;

forming a well region in the substrate outside the trench by means of an ion implantation process;

forming a source region in the well region by means of an ion implantation process;

performing second lateral etching on the hard mask layer to expose the surface of the well region outside the source region;

forming a well contact region in the well region by means of an ion implantation process, the well contact region being located outside the source region;

forming a second dielectric layer covering the second polysilicon layer and the well region, the second dielectric layer not covering the hard mask layer;

removing the hard mask layer, and forming a Schottky implantation region outside the well region, the bottom of the Schottky implantation region being higher than the bottom of the well region; and etching the second dielectric layer to expose the surfaces of the source region, the Schottky implantation region, and the well contact region.

Optionally, the step of forming the shield gate dielectric layer and the first polysilicon layer includes:

forming the shield gate dielectric layer on the side wall and bottom of the trench;

depositing first polysilicon to fill the trench; and etching back the first polysilicon to form the first polysilicon layer, the surface of the first polysilicon layer being lower than the surface of the substrate.

Optionally, the step of forming the first dielectric layer and the second polysilicon layer includes:

forming the first dielectric layer above the first polysilicon layer in the trench, the surface of the first dielectric layer being lower than the surface of the substrate, and the shield gate dielectric layer above the first dielectric layer in the trench being removed; and forming the second polysilicon layer in the trench, the second polysilicon layer covering the first dielectric layer and the shield gate dielectric layer, and the top of the second polysilicon layer being lower than the surface of the substrate.

Optionally, the step of forming the source region in the well region by means of the ion implantation process includes:
performing angled ion implantation to form the source region at the top of the well region and on the side wall of the trench above the second polysilicon layer.

Optionally, the step of forming the second dielectric layer covering the second polysilicon layer and the well region includes:
forming the second dielectric layer, the second dielectric layer covering the hard mask layer, the well region, and the second polysilicon layer in the trench; and
removing the second dielectric layer above the hard mask layer.

Optionally, the step of removing the hard mask layer and forming the Schottky implantation region outside the well region includes:
removing the hard mask layer, and defining a Schottky implantation region pattern outside the well region; and
forming the Schottky implantation region outside the well region by means of an ion implantation process.

Optionally, the surface of the etched second dielectric layer is higher than the surface of the substrate.

Optionally, the surface of the etched second dielectric layer is flush with the surface of the substrate.

Optionally, after the step of etching the second dielectric layer and the hard mask layer to expose the surfaces of the source region, the Schottky implantation region, and the well contact region, the method further includes:
forming a front metal layer on the front side of the substrate; and
forming a back metal layer on the back side of the substrate.

The technical solutions of the present application have at least the following advantages:
By forming a trench shield gate in the substrate and forming the Schottky implantation region outside the well region, the Schottky implantation region and an epitaxial layer form a Schottky contact, solving the problem of a slow switching speed of the existing shield gate trench MOSFET, achieving the effects of reducing the forward on-voltage of a body diode and improving the switching speed.

BRIEF DESCRIPTION OF THE DRAWINGS

In order to more clearly explain the specific implementations of the present application or the technical solution in the prior art, the drawings required in description of the specific implementations or the prior art will be briefly described below. It is obvious that the drawings described below are some implementations of the present application, and those skilled in the art could also obtain other drawings on the basis of these drawings, without involving any inventive skill.

Figure 1:
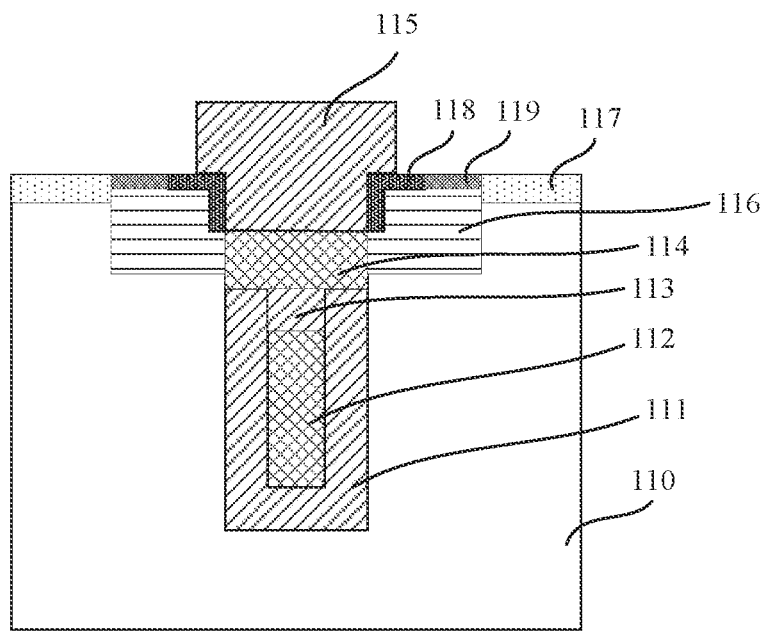
FIG. 1 is a schematic structural diagram of a shield gate trench MOSFET device provided by an embodiment of the present application.

Description of reference numerals: 110, substrate; 111, shield gate dielectric layer; 112, first polysilicon layer; 113, first dielectric layer; 114, second polysilicon layer; 115, second dielectric layer; 116, well region; 117, Schottky implantation region; 118, source region; 119, well contact region; 120, front metal layer; 121, back metal layer; 122, hard mask layer; 123, trench.

DETAILED DESCRIPTION

The technical solutions of the present application will be clearly and completely described below with reference to the drawings. Obviously, the described embodiments are part of the embodiments of the present application, rather than all of them. Based on the embodiments in the present application, all other embodiments obtained by those skilled in the art without involving any inventive skill shall fall into the protection scope of the present application.

In the description of the present application, it should be noted that the orientation or position relationship indicated by the terms "center", "upper", "lower", "left", "right", "vertical", "horizontal", "inner", "outer", etc. is based on the orientation or position relationship shown in the drawings, intended only for the convenience of describing the present application and simplifying the description, rather than indicating or implying that the apparatus or element referred to necessarily has a specific orientation or is configured or operated in a specific orientation, and thus cannot be construed as a limitation on the present application. In addition, the terms "first", "second", and "third" are used for descriptive purposes only, and cannot be construed as indicating or implying relative importance.

In the description of the present application, it should be noted that, unless otherwise clearly specified and limited, the terms "mounting", "coupling", and "connecting" should be understood in a broad sense, for example, it can be a fixed connection, a detachable connection, or an integrated connection, can be a mechanical connection or an electrical connection, can be a direct connection, an indirect connection implemented by means of an intermedium, or an internal connection between two components, and can be a wireless connection or a wired connection. Those skilled in the art could understand the specific meanings of the above terms in the present application on the basis of specific situations.

In addition, the technical features involved in different embodiments of the present application described below can be combined with each other in the case of no conflict.

Please refer to FIG. 1, which is a schematic structural diagram of a shield gate trench MOSFET device provided by an embodiment of the present application.

Referring to FIG. 1, the shield gate trench MOSFET device includes a substrate 110, and a trench is provided in the substrate 110.

Optionally, the substrate consists of a silicon substrate and an epitaxial layer over the silicon substrate.

A lower portion of the trench is filled with a shield gate dielectric layer 111 and a first polysilicon layer 112, the shield gate dielectric layer 111 covers the side wall and bottom of the trench, and the first polysilicon layer 112 is located between the shield gate dielectric layers 111.

An upper portion of the trench is filled with a first dielectric layer 113, a second polysilicon layer 114, and a second dielectric layer 115, the first dielectric layer 113 is located above the shield gate dielectric layer 111 and the first polysilicon layer 112, the second polysilicon layer 114 is located above the first dielectric layer 113, the second dielectric layer 115 is located above the second polysilicon layer 114, and the top of the second polysilicon layer 114 is lower than the surface of the substrate.

The substrate 110 is further provided with a well region 116 and a Schottky implantation region 117, the well region 116 is located outside the trench, the Schottky implantation region 117 is located outside the well region 116, and the bottom of the Schottky implantation region 117 is higher than the bottom of the well region 116.

A source region 118 and a well contact region 119 are provided in the well region 116, and the well contact region 119 is located between the source region 118 and the Schottky implantation region 117.

Figure 2:
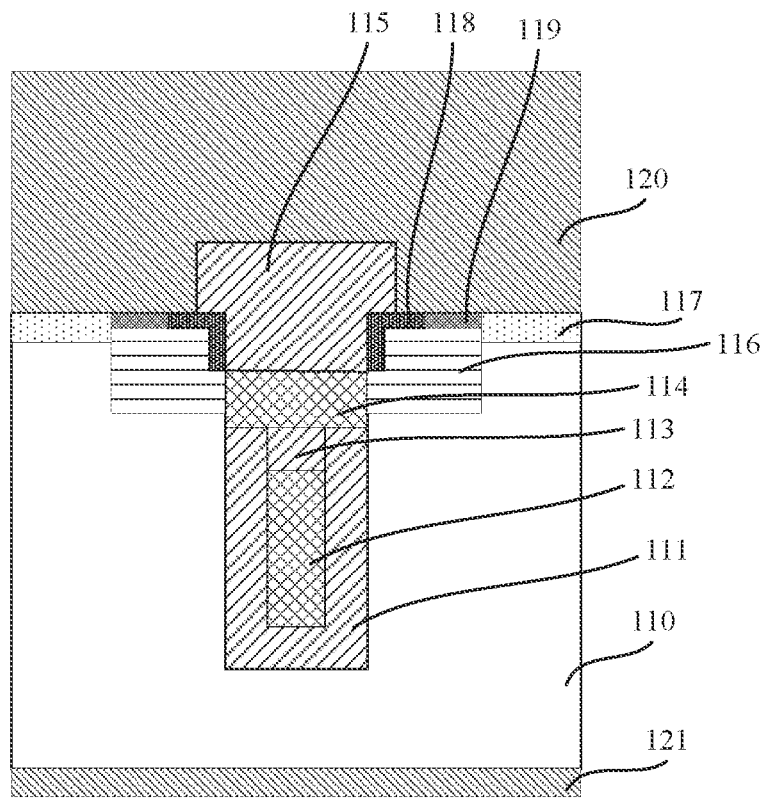
FIG. 2 is a schematic structural diagram of a shield gate trench MOSFET device provided by an embodiment of the present application.

Referring to FIG. 2, the shield gate trench MOSFET device further includes a front metal layer 120 on the front side of the substrate 110 and a back metal layer 121 on the back side of the substrate 110.

The front metal layer 120 is connected to the surface of the Schottky implantation region 117, the surface of the source region 118, and the surface of the well contact region 119.

In the shield gate trench MOSFET device provided by the embodiment of the present application, by forming the Schottky implantation region outside the well region, the forward on-voltage of a body diode is reduced and the switching speed can be improved.

Referring to FIG. 1 or FIG. 2, the surface of the second dielectric layer 115 is higher than the surface of the substrate 110.

Figure 3:
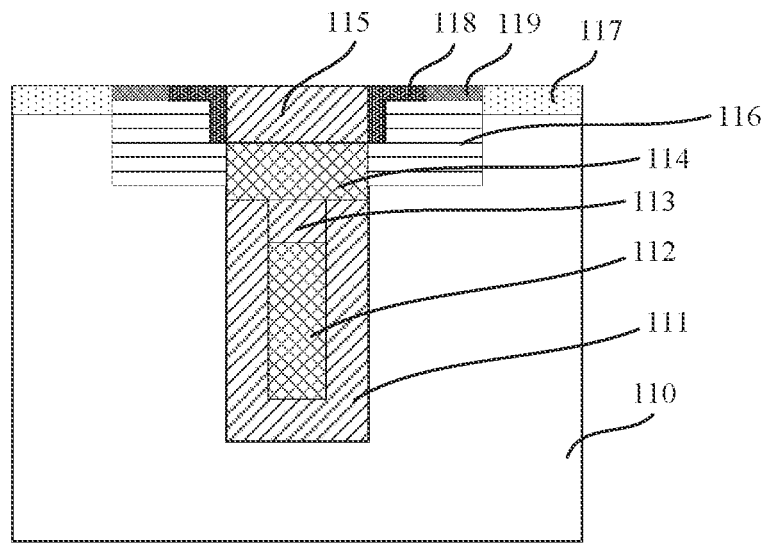
FIG. 3 is a schematic structural diagram of a shield gate trench MOSFET device provided by another embodiment of the present application.
Figure 4:
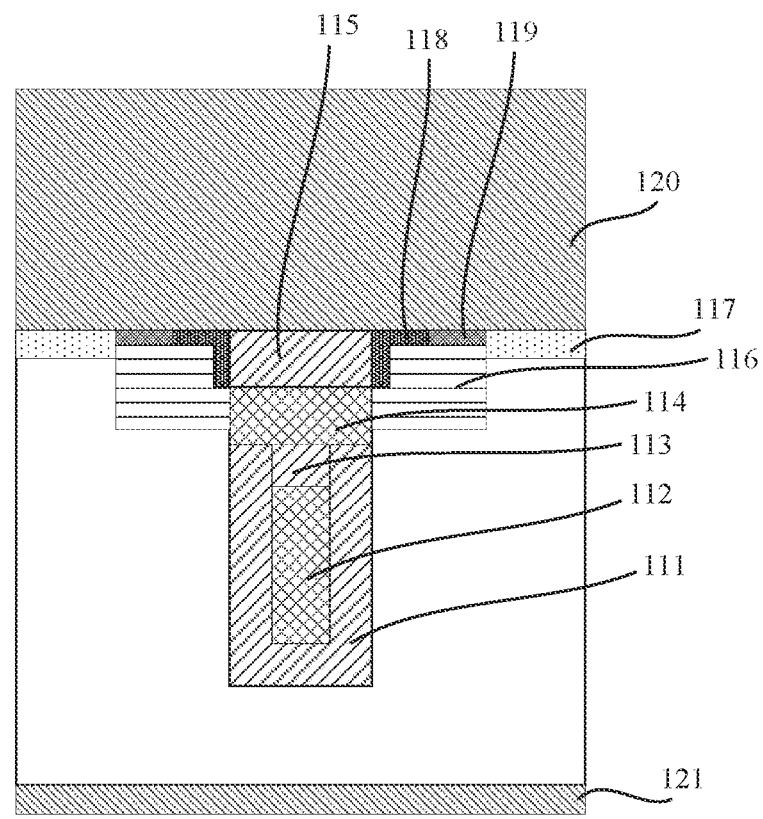
FIG. 4 is a schematic structural diagram of a shield gate trench MOSFET device provided by another embodiment of the present application.

Referring to FIG. 3 or FIG. 4, the surface of the second dielectric layer 115 is flush with the surface of the substrate 110.

The source region 118 is located at the top of the well region 116 and in the well region corresponding to the side wall of the top of the trench.

Referring to FIG. 1 or FIG. 2 or FIG. 3 or FIG. 4, the source region 118 has an inverted-L shape and is located in the well region 116 on two sides of the top of the trench.

The well contact region 119 is located at the top of the well region 116.

Figure 5:
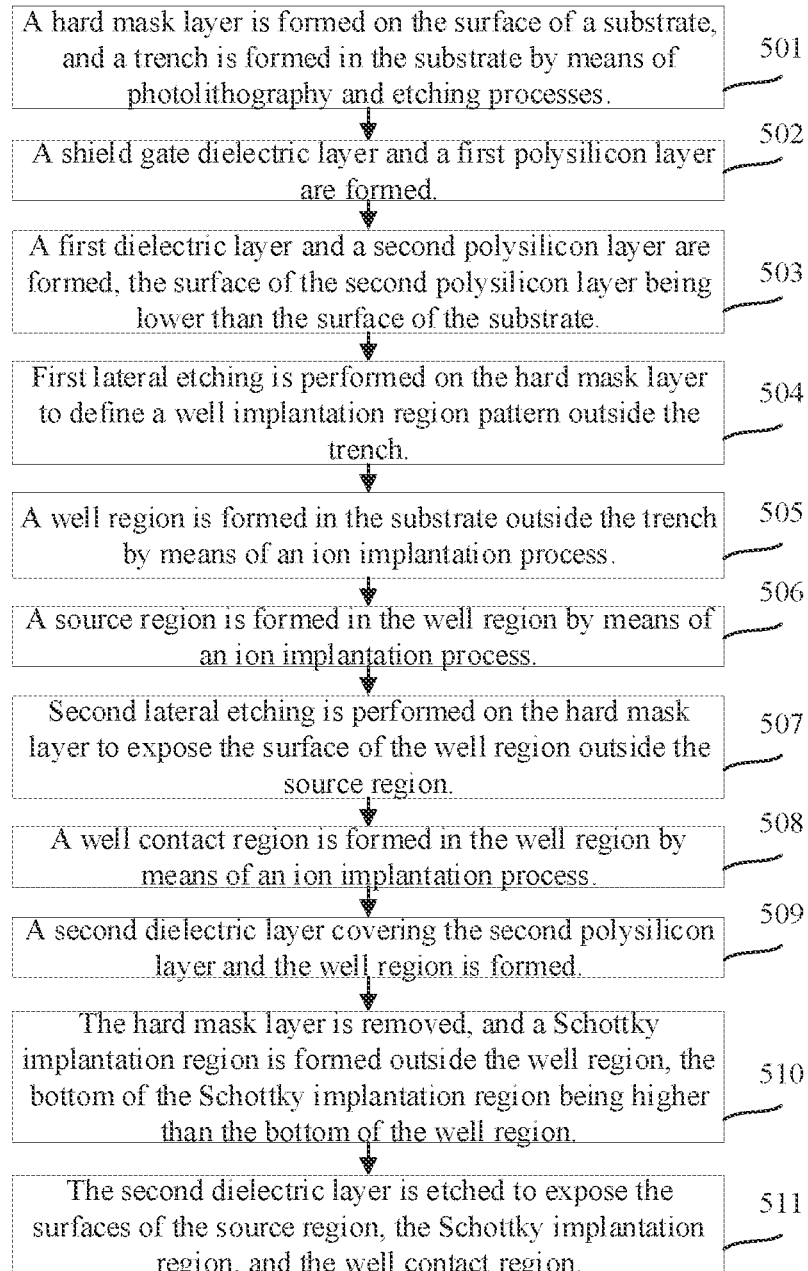
FIG. 5 is a flowchart of a method for manufacturing a shield gate trench MOSFET device provided by an embodiment of the present application.

Please refer to FIG. 5, which is a flowchart of a method for manufacturing a shield gate trench MOSFET device provided by an embodiment of the present application. The method includes at least the following steps:

Step 501. A hard mask layer is formed on the surface of a substrate, and a trench is formed in the substrate by means of photolithography and etching processes.

Optionally, the substrate consists of a silicon substrate and an epitaxial layer over the silicon substrate.

Step 502. A shield gate dielectric layer and a first polysilicon layer are formed.

The shield gate dielectric layer covers the side wall and bottom of a lower portion of the trench, and the first polysilicon layer is located between the shield gate dielectric layers.

The space within the trench is divided into an upper space and a lower space. The shield gate dielectric layer covers the bottom of the trench and the side wall of the lower portion of the trench.

Step 503. A first dielectric layer and a second polysilicon layer are formed, the surface of the second polysilicon layer being lower than the surface of the substrate.

The first dielectric layer is formed, and the second polysilicon layer is formed.

The first dielectric layer is located above the first polysilicon layer, the second polysilicon layer is located above the first dielectric layer, the first polysilicon layer is completely enclosed by the first dielectric layer and the shield gate dielectric layer, and the second polysilicon layer completely covers the shield gate dielectric layer and the first dielectric layer.

Step 504. First lateral etching is performed on the hard mask layer to define a well implantation region pattern outside the trench.

Step 505. A well region is formed in the substrate outside the trench by means of an ion implantation process.

Step 506. A source region is formed in the well region by means of an ion implantation process.

Step 507. Second lateral etching is performed on the hard mask layer to expose the surface of the well region outside the source region.

Step 508. A well contact region is formed in the well region by means of an ion implantation process.

The well contact region is located outside the source region.

Step 509. A second dielectric layer covering the second polysilicon layer and the well region is formed.

The second dielectric layer is formed on the substrate, the second dielectric layer fills the remaining space in the trench, the second polysilicon layer and the well region are covered by the second dielectric layer, and the second dielectric layer does not cover the hard mask layer.

Step 510. The hard mask layer is removed, and a Schottky implantation region is formed outside the well region, the bottom of the Schottky implantation region being higher than the bottom of the well region.

A Schottky implantation region pattern is defined outside the well region by etching the hard mask layer, and the Schottky implantation region is formed outside the well region by means of an ion implantation process, and the bottom of the Schottky implantation region is higher than the bottom of the well region.

The surface of the Schottky implantation region is not covered by the hard mask layer and the second dielectric layer, and the surface of the Schottky implantation region is exposed.

Due to the formation of the Schottky implantation region, the Schottky implantation region and an epitaxial layer form a Schottky contact on the silicon surface, which reduces the forward on-voltage of a body diode and improve the switching speed.

Step 511. The second dielectric layer is etched to expose the surfaces of the source region, the Schottky implantation region, and the well contact region.

Optionally, the second dielectric layer and the remaining hard mask layer on the surface of the substrate are etched to expose the surface of the source region, the surface of the well contact region, and the surface of the Schottky implantation region.

To sum up, in the method for manufacturing a shield gate trench MOSFET device provided by the embodiment of the present application, a trench shield gate is formed in the substrate, and the Schottky implantation region is formed outside the well region, so that the Schottky implantation region and the epitaxial layer form the Schottky contact, solving the problem of a slow switching speed of the existing shield gate trench MOSFET, achieving the effects of reducing the forward on-voltage of a body diode and improving the switching speed.

Another embodiment of the present application provides a method for manufacturing a shield gate trench MOSFET device. The method includes the following steps:

Step 601. A hard mask layer is formed on the surface of a substrate, and a trench is formed in the substrate by means of photolithography and etching processes.

Optionally, several hard mask layers are formed on the surface of the substrate. For example, three hard mask layers are formed on the surface of the substrate.

A trench pattern is defined on the surface of the hard mask layer by means of a photolithography process, the hard mask layer is etched, the trench pattern is copied into the hard mask layer, and a photoresist on the surface of the hard mask layer is removed. The substrate is etched by using the etched hard mask layer as a mask, so as to form the trench in the substrate.

Figure 6:
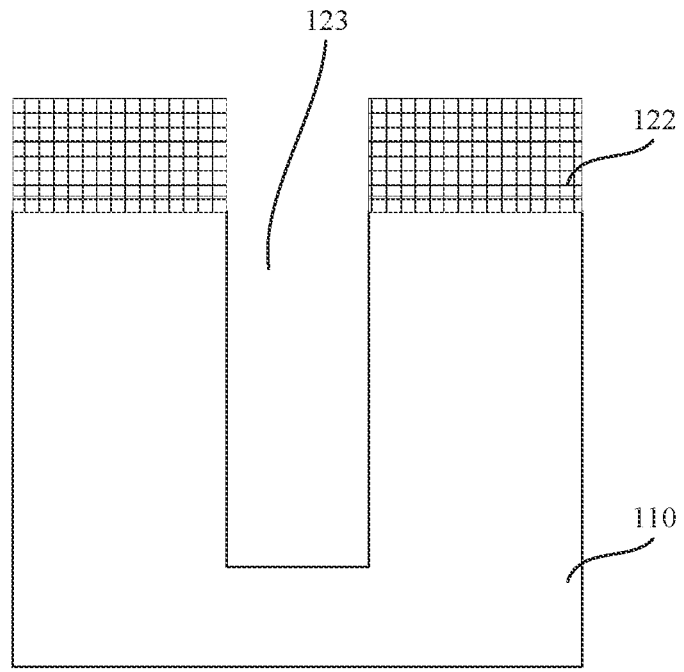
FIG. 6 is a schematic diagram of the device in the process of manufacturing the shield gate trench MOSFET device provided by an embodiment of the present application.

Referring to FIG. 6, a hard mask layer 122 is formed on the surface of a substrate 110, and a trench 123 is formed in the substrate 110.

Step 602. A shield gate dielectric layer is formed on the side wall and bottom of the trench.

Figure 7:
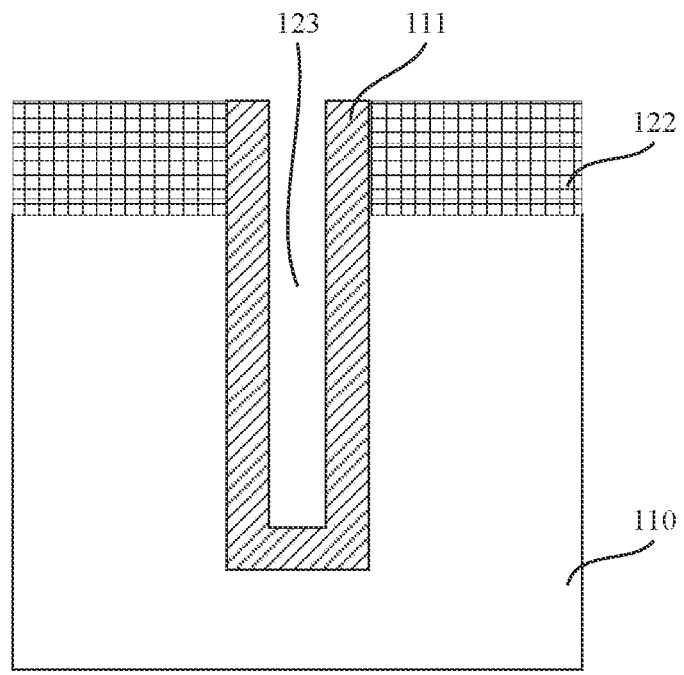
FIG. 7 is a schematic diagram of the device in the process of manufacturing the shield gate trench MOSFET device provided by an embodiment of the present application.

The shield gate dielectric layer is grown, referring to FIG. 7, the shield gate dielectric layer 111 is formed on the side wall and bottom of the trench 123.

Step 603. First polysilicon is deposited to fill the trench.

Figure 8:
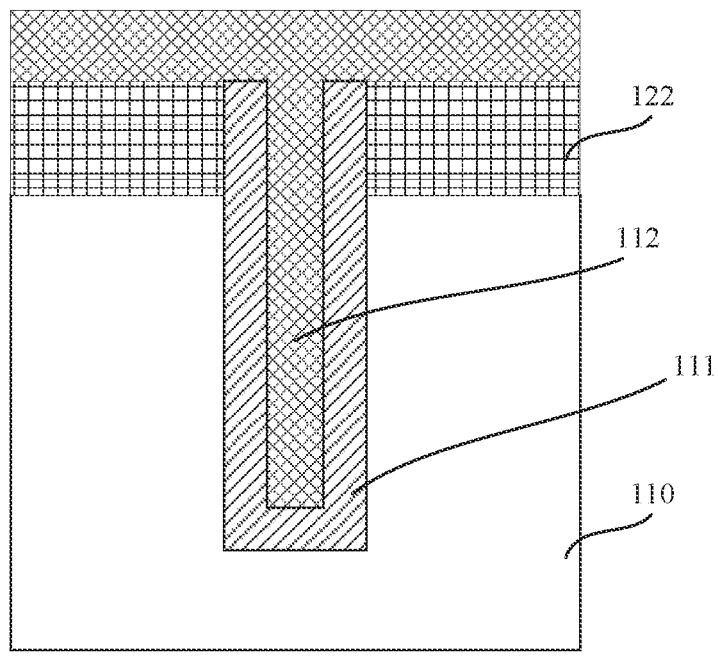
FIG. 8 is a schematic diagram of the device in the process of manufacturing the shield gate trench MOSFET device provided by an embodiment of the present application.

The first polysilicon is deposited on the substrate 110, and the trench is fully filled with the first polysilicon 112, as shown in FIG. 8.

Step 604. The first polysilicon is etched back to form a first polysilicon layer, the surface of the first polysilicon layer being lower than the surface of the substrate.

Figure 9:
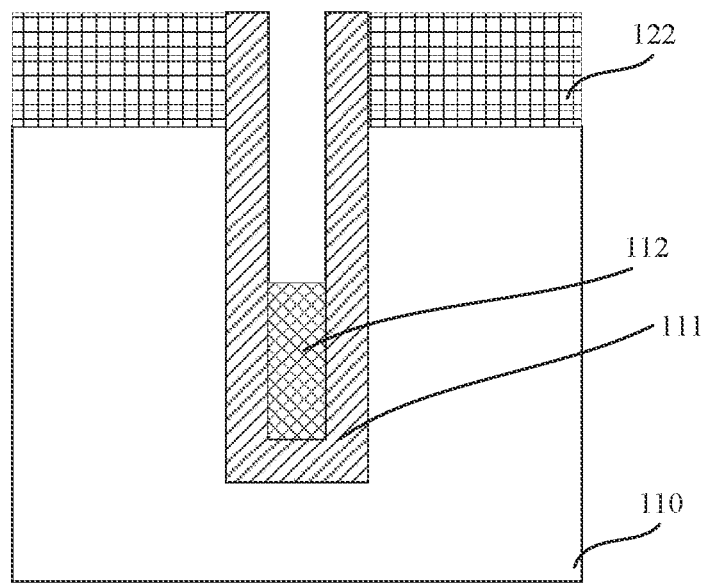
FIG. 9 is a schematic diagram of the device in the process of manufacturing the shield gate trench MOSFET device provided by an embodiment of the present application.

The space in the trench is divided into an upper space and a lower space, and the first polysilicon layer 112 formed after etching back the first polysilicon is located at a lower portion of the trench, as shown in FIG. 9.

Step 605. A first dielectric layer is formed above the first polysilicon layer in the trench, the surface of the first dielectric layer being lower than the surface of the substrate.

Optionally, a first dielectric layer is grown to fill the trench, the substrate is etched back, the first dielectric layer of a predetermined thickness is retained, and the shield gate dielectric layer above the first dielectric layer is also removed.

Figure 10:
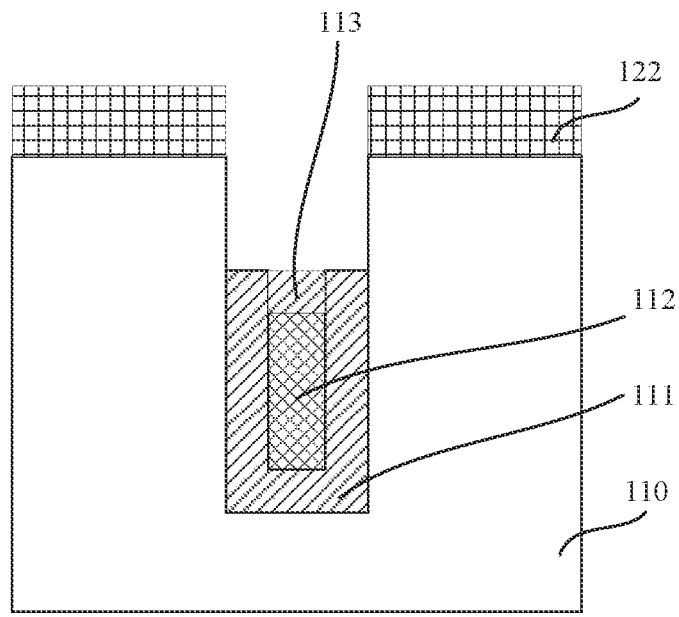
FIG. 10 is a schematic diagram of the device in the process of manufacturing the shield gate trench MOSFET device provided by an embodiment of the present application.

Referring to FIG. 10, the surface of the first dielectric layer 113 is lower than the surface of the substrate 110, the first dielectric layer 113 covers the first polysilicon layer 112, and the first polysilicon layer 112 is enclosed by the first dielectric layer 113 and the shield gate dielectric layer 111.

Step 606. A second polysilicon layer is formed in the trench, the second polysilicon layer covering the first dielectric layer and the shield gate dielectric layer, and the top of the second polysilicon layer being lower than the surface of the substrate.

Optionally, second polysilicon is deposited to fill the trench, and the second polysilicon is over-etched to form the second polysilicon layer, the surface of the second polysilicon layer being lower than the surface of the substrate.

Figure 11:
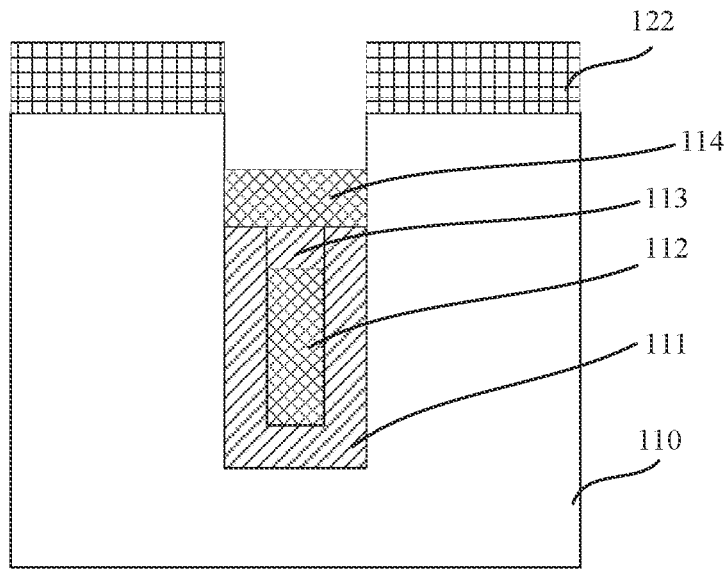
FIG. 11 is a schematic diagram of the device in the process of manufacturing the shield gate trench MOSFET device provided by an embodiment of the present application.

Referring to FIG. 11, the surface of the second polysilicon layer 114 is lower than the surface of the substrate 110.

Step 607. First lateral etching is performed on the hard mask layer to define a well implantation region pattern outside the trench.

The first lateral etching is performed on the hard mask layer 122 on two sides of the trench to define the well implantation region pattern outside the trench.

Step 608. A well region is formed in the substrate outside the trench by means of an ion implantation process.

Figure 12:
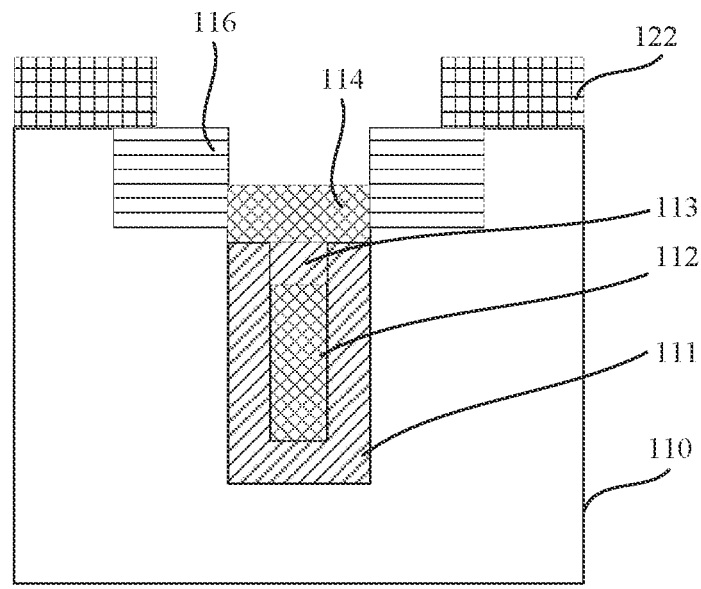
FIG. 12 is a schematic diagram of the device in the process of manufacturing the shield gate trench MOSFET device provided by an embodiment of the present application.

The well region ion implantation is performed on the substrate corresponding to the well implantation region pattern by using the hard mask layer as a mask, and drive-in is performed. Referring to FIG. 12, the well region 116 is formed in the substrate 110 outside the trench.

Step 609. Angled ion implantation is performed to form a source region at the top of the well region and on the side wall of the trench above the second polysilicon layer.

Figure 13:
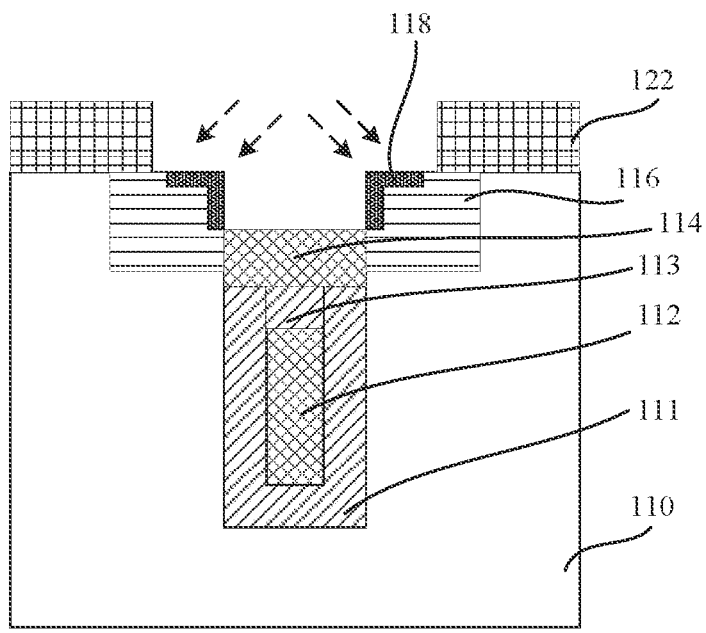
FIG. 13 is a schematic diagram of the device in the process of manufacturing the shield gate trench MOSFET device provided by an embodiment of the present application.

Referring to FIG. 13, the angled ion implantation is performed, and dopant ions are implanted into the top of the well region 116 that is not shielded by the hard mask layer 122 and the side wall of the trench above the second polysilicon layer 114, so as to form the source region 118 having an inverted-L shape.

Step 610. Second lateral etching is performed on the hard mask layer to expose the surface of the well region outside the source region.

The lateral etching of the hard mask layer on two sides of the trench continues, so as to expose the surface of the well region outside the source region 118, and the hard mask layer 122 still covers the surface of the substrate outside the well region 116.

Step 611. A well contact region is formed in the well region by means of an ion implantation process.

Figure 14:
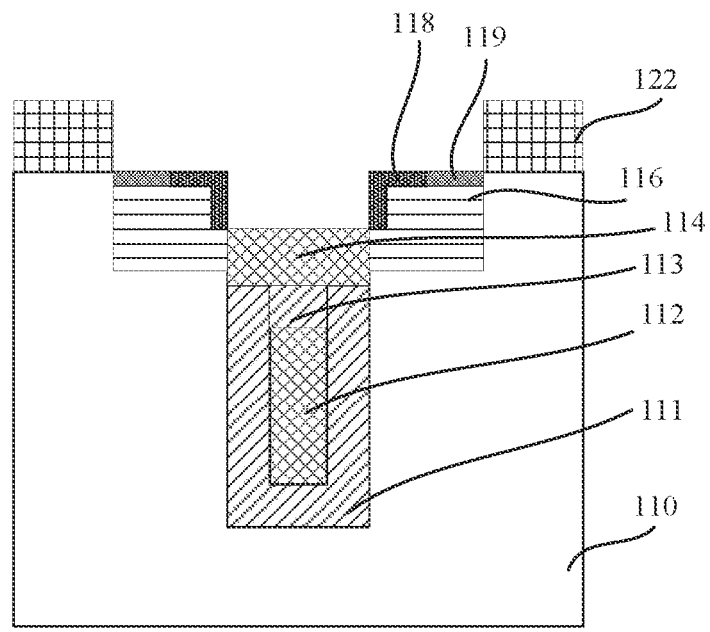
FIG. 14 is a schematic diagram of the device in the process of manufacturing the shield gate trench MOSFET device provided by an embodiment of the present application.

Referring to FIG. 14, after the second lateral etching of the hard mask layer, the surface of the well region 116 is exposed, and the well contact region 119 is formed in the well region 116 by means of the ion implantation process, the well contact region 119 being located outside the source region 118.

Step 612. A second dielectric layer is formed, the second dielectric layer covering the hard mask layer, the well region, and the second polysilicon layer in the trench.

Figure 15:
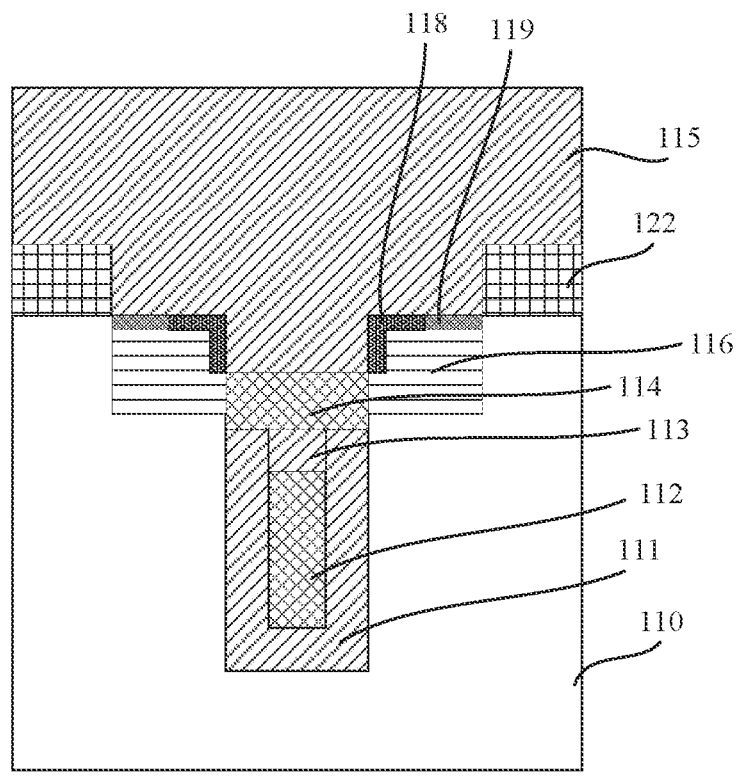
FIG. 15 is a schematic diagram of the device in the process of manufacturing the shield gate trench MOSFET device provided by an embodiment of the present application.

Referring to FIG. 15, the second dielectric layer 115 is deposited on the substrate 110, the second dielectric layer 115 fills the remaining space in the trench, and the second dielectric layer 115 covers the hard mask layer 122, the well region 116, and the second polysilicon layer 114 in the trench.

Step 613. The second dielectric layer above the hard mask layer is removed.

Figure 16:
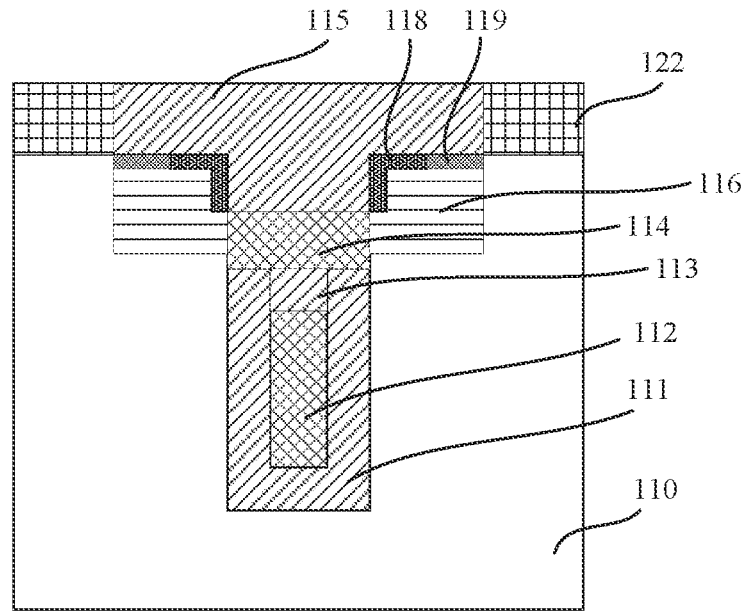
FIG. 16 is a schematic diagram of the device in the process of manufacturing the shield gate trench MOSFET device provided by an embodiment of the present application.

Etching back or CMP processing is performed on the second dielectric layer 115 to reduce the thickness of the second dielectric layer 115, such that the top of the second dielectric layer 115 is flush with the hard mask layer 122, as shown in FIG. 16.

Step 614. The hard mask layer is removed, and a Schottky implantation region pattern is defined outside the well region.

Figure 17:
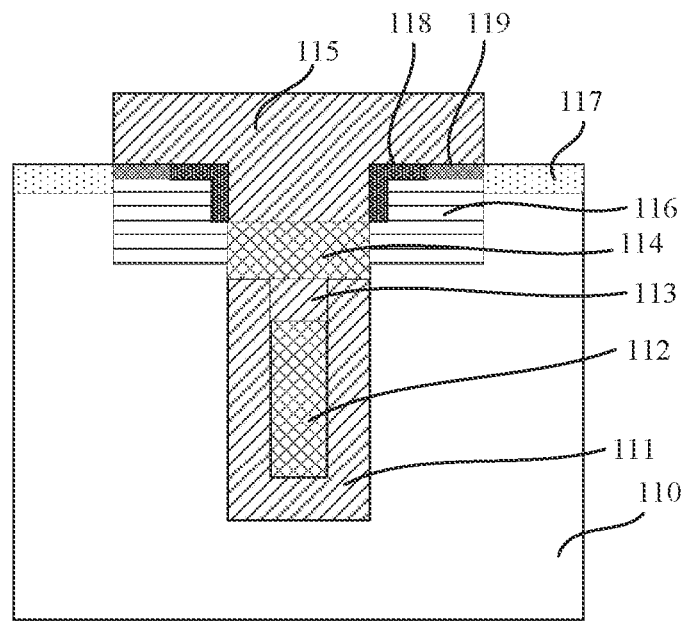
FIG. 17 is another schematic diagram of the device in the process of manufacturing the shield gate trench MOSFET device provided by an embodiment of the present application.

Referring to FIG. 17, the hard mask layer outside the second dielectric layer 115 is removed, and the Schottky implantation region pattern is defined outside the well region 116.

Step 615. A Schottky implantation region is formed outside the well region by means of an ion implantation process.

Doping ions are implanted into the substrate 110 corresponding to the Schottky implantation region pattern, and the Schottky implantation region 117 is formed outside the well region 116.

Step 616. The second dielectric layer is etched to expose the surfaces of the source region, the Schottky implantation region, and the well contact region.

In an example, referring to FIG. 1, the surface of the etched second dielectric layer is higher than the surface of the substrate.

In another example, referring to FIG. 3, the surface of the etched second dielectric layer is flush with the surface of the substrate.

Step 617. A front metal layer is formed on the front side of the substrate.

The front metal layer 120 is connected to the source region 118, the well contact region 119, and the Schottky implantation region 117.

Step 618. A back metal layer is formed on the back side of the substrate.

Optionally, the back side of the substrate is thinned, and metal is deposited on the back side of the substrate to form the back metal layer.

Referring to FIG. 2 or FIG. 4, the front metal layer 120 is formed on the front side of the substrate 110, and the back metal layer 121 is formed on the back side of the substrate 110.

Obviously, the above embodiments are merely examples used for clear description, rather than for limitation on the implementations. Those skilled in the art could also make other changes or modifications in different forms on the basis of the above description. There is no need or way to exhaustively list all of the implementations herein, but obvious changes or modifications derived herefrom still fall within the protection scope created by the present application.

What is claimed is:

1. A shield gate trench MOSFET device, comprising:
 a substrate, a trench being provided in the substrate, wherein
 a lower portion of the trench is filled with a shield gate dielectric layer and a first polysilicon layer, the shield gate dielectric layer covers the side walls and bottom of the trench, and the first polysilicon layer is located between the shield gate dielectric layer;
 an upper portion of the trench is filled with a first dielectric layer, a second polysilicon layer, and a second dielectric layer, the first dielectric layer is located above the first polysilicon layer, the second polysilicon layer is located above the first dielectric layer and the shield gate dielectric layer, and in direct contact with the side walls of the trench, the second dielectric layer is located above the second polysilicon layer, and the top of the second polysilicon layer is lower than the surface of the substrate;
 the substrate is further provided with a well region and a Schottky implantation region, the well region is located outside the trench, the Schottky implantation region is located outside the well region, and the bottom of the Schottky implantation region is higher than the bottom of the well region; and
 an inverted L-shaped source region and a well contact region are provided in the well region, the inverted L-shaped source region is located at one top part of the well region and on a side of the well region at a top of the trench, and the well contact region is located at another top part of the well region and between the inverted L-shaped source region and the Schottky implantation region.

2. The shield gate trench MOSFET device according to claim 1, wherein a surface of the second dielectric layer is higher than the surface of the substrate.

3. The shield gate trench MOSFET device according to claim 1, further comprising a front metal layer on a front side of the substrate, and a back metal layer on a back side of the substrate.

* * * * *